(12) United States Patent
Meyer et al.

(10) Patent No.: US 12,035,477 B2
(45) Date of Patent: Jul. 9, 2024

(54) ELECTRONIC MODULE AND METHOD FOR PRODUCING AN ELECTRONIC MODULE

(71) Applicant: Rogers Germany GmbH, Eschenbach (DE)

(72) Inventors: Andreas Meyer, Speichersdorf (DE); Karsten Schmidt, Eschenbach (DE); Tilo Welker, Neuhaus (DE)

(73) Assignee: ROGERS GERMANY GMBH, Eschenbach (DE)

( * ) Notice: Subject to any disclaimer, the term of this patent is extended or adjusted under 35 U.S.C. 154(b) by 76 days.

(21) Appl. No.: 17/910,151

(22) PCT Filed: Mar. 8, 2021

(86) PCT No.: PCT/EP2021/055760
§ 371 (c)(1),
(2) Date: Sep. 8, 2022

(87) PCT Pub. No.: WO2021/180639
PCT Pub. Date: Sep. 16, 2021

(65) Prior Publication Data
US 2023/0094926 A1    Mar. 30, 2023

(30) Foreign Application Priority Data

Mar. 10, 2020 (DE) .......................... 102020106521.3

(51) Int. Cl.
*H05K 1/18* (2006.01)
*H05K 1/03* (2006.01)
*H05K 3/42* (2006.01)

(52) U.S. Cl.
CPC .......... *H05K 1/181* (2013.01); *H05K 1/0306* (2013.01); *H05K 1/183* (2013.01); *H05K 3/429* (2013.01);
(Continued)

(58) Field of Classification Search
CPC ....... H05K 1/181; H05K 1/0306; H05K 1/183
See application file for complete search history.

(56) References Cited

U.S. PATENT DOCUMENTS

| | | | |
|---|---|---|---|
| 3,744,120 A | 7/1973 | Burgess et al. | |
| 6,232,657 B1* | 5/2001 | Komorita | C04B 35/584 257/713 |

(Continued)

FOREIGN PATENT DOCUMENTS

| | | |
|---|---|---|
| DE | 2319854 C2 | 12/1983 |
| DE | 3930858 A1 | 3/1990 |

(Continued)

OTHER PUBLICATIONS

International Preliminary Report On Patentability for International Application No. PCT/EP2021/055760, International Filing Date Mar. 8, 2021, Mailing date Sep. 15, 2022, 6 pages.

*Primary Examiner* — Sherman Ng
(74) *Attorney, Agent, or Firm* — CANTOR COLBURN LLP

(57) ABSTRACT

An electronics module (100), especially a power electronics module, comprising
a metal-ceramic substrate (1) serving as a carrier and having a ceramic element (10) and a primary component metallization (21),
an insulation layer (40) directly or indirectly connected to the primary component metallization (21), and
a secondary component metallization (22) which is connected to the side of the insulation layer (40) facing away from the metal-ceramic substrate (1) and is especially isolated from the primary component metallization (21) using the insulation layer (40),
wherein the ceramic element (10) has a first size (L1, D1) and the insulation layer (40) has a second size (L2, D2) and a ratio of the second size (L2, D2) to the first size (Continued)

(L1, D1) has a value smaller than 0.8, to form an island-like insulation layer (40) on the primary component metallization (21).

15 Claims, 17 Drawing Sheets

(52) U.S. Cl.
CPC .............. *H05K 2201/09036* (2013.01); *H05K 2201/09545* (2013.01); *H05K 2201/10666* (2013.01); *H05K 2203/049* (2013.01)

(56) References Cited

U.S. PATENT DOCUMENTS

| | | | |
|---|---|---|---|
| 8,154,114 B2 | 4/2012 | Bayerer | |
| 8,441,128 B2 * | 5/2013 | Domes | H01L 23/3735 327/437 |
| 9,515,061 B2 | 12/2016 | Inokuchi et al. | |
| 11,011,440 B2 | 5/2021 | Yamazaki et al. | |
| 2009/0039498 A1 | 2/2009 | Bayerer | |
| 2012/0107642 A1* | 5/2012 | Meyer | C04B 37/021 156/60 |
| 2016/0056132 A1 | 2/2016 | Beyerer et al. | |

FOREIGN PATENT DOCUMENTS

| | | |
|---|---|---|
| DE | 10227658 A1 | 1/2004 |
| DE | 19927046 B4 | 1/2007 |
| DE | 102009033029 A1 | 1/2011 |
| DE | 102011101052 A1 | 11/2012 |
| DE | 102013104739 A1 | 9/2014 |
| DE | 102013210146 A1 | 12/2014 |
| EP | 2432014 A1 | 3/2012 |
| JP | 2003086747 A | 3/2003 |
| JP | 2009044152 | 2/2009 |
| JP | 2014053384 | 3/2014 |
| JP | 2016115900 | 6/2016 |
| JP | 6437162 B1 | 11/2018 |

* cited by examiner

ELECTRONIC MODULE AND METHOD FOR PRODUCING AN ELECTRONIC MODULE

CROSS-REFERENCE TO RELATED APPLICATIONS

This application is a National Stage filing of PCT/EP2021/055760, filed Mar. 8, 2021, which claims priority to DE 10 2020 106 521.3, filed Mar. 10, 2020, both of which are incorporated by reference in their entirety herein.

BACKGROUND

The present invention relates to an electronics module and a method of producing an electronics module.

Electronics modules are known from prior art, especially from power electronics, in which metal-ceramic substrates serve as printed circuit boards. Metal-ceramic substrates are, for example, sufficiently known from prior art as printed circuit boards or circuit boards, for example from DE 10 2013 104 739 A1, DE 19 927 046 B4 and DE 10 2009 033 029 A1. Typically, terminal areas for electrical components and conducting tracks are arranged on one component side of the metal-ceramic substrate, wherein the electrical components and the conducting tracks can be interconnected to form electrical circuits. Essential components of the metal-ceramic substrates are an insulation layer, which is preferably manufactured from a ceramic material, and at least one metal layer connected to the insulation layer. Because of their comparatively high insulation strengths, insulation layers made of ceramic materials have proved to be particularly advantageous in power electronics. By patterning the metal layer, conducting tracks and/or terminal areas for the electrical components may be realized.

SUMMARY

It is an object of the present invention to provide an electronics module which is improved compared to the electronics modules known from prior art, especially regarding the manufacturing effort and efficiency in making use of the substrate area of the metal-ceramic substrate.

This object is solved by providing an electronics module as described herein and a method as described herein. Further advantages and features arise from the claims as well as from the description and the accompanying figures.

According to a first aspect of the present invention, an electronics module, especially a power electronics module will be provided, comprising
- a metal-ceramic substrate serving as a carrier and having a ceramic element and a primary component metallization and preferably having a cooling component metallization, i.e., a back side component metallization
- an insulation layer directly or indirectly connected to the primary component metallization, and
- a secondary component metallization which is connected to the side of the insulation layer facing away from the metal-ceramic substrate and is especially isolated from the primary component metallization by the insulation layer,
wherein the ceramic element has a first size and the insulation layer has a second size and wherein a ratio of the second size to the first size assumes a value which is smaller than 0.8, preferably smaller than 0.6 and more preferably smaller than 0.4 to form an island-like insulation layer on the primary component metallization.

BRIEF DESCRIPTION OF THE DRAWINGS

Further advantages and features will be apparent from the following description of preferred embodiments of the object according to the invention while making reference to the accompanying figures. Individual features of the individual embodiment may be combined with each other within the scope of the invention, wherein.

DETAILED DESCRIPTION

Figure 1:
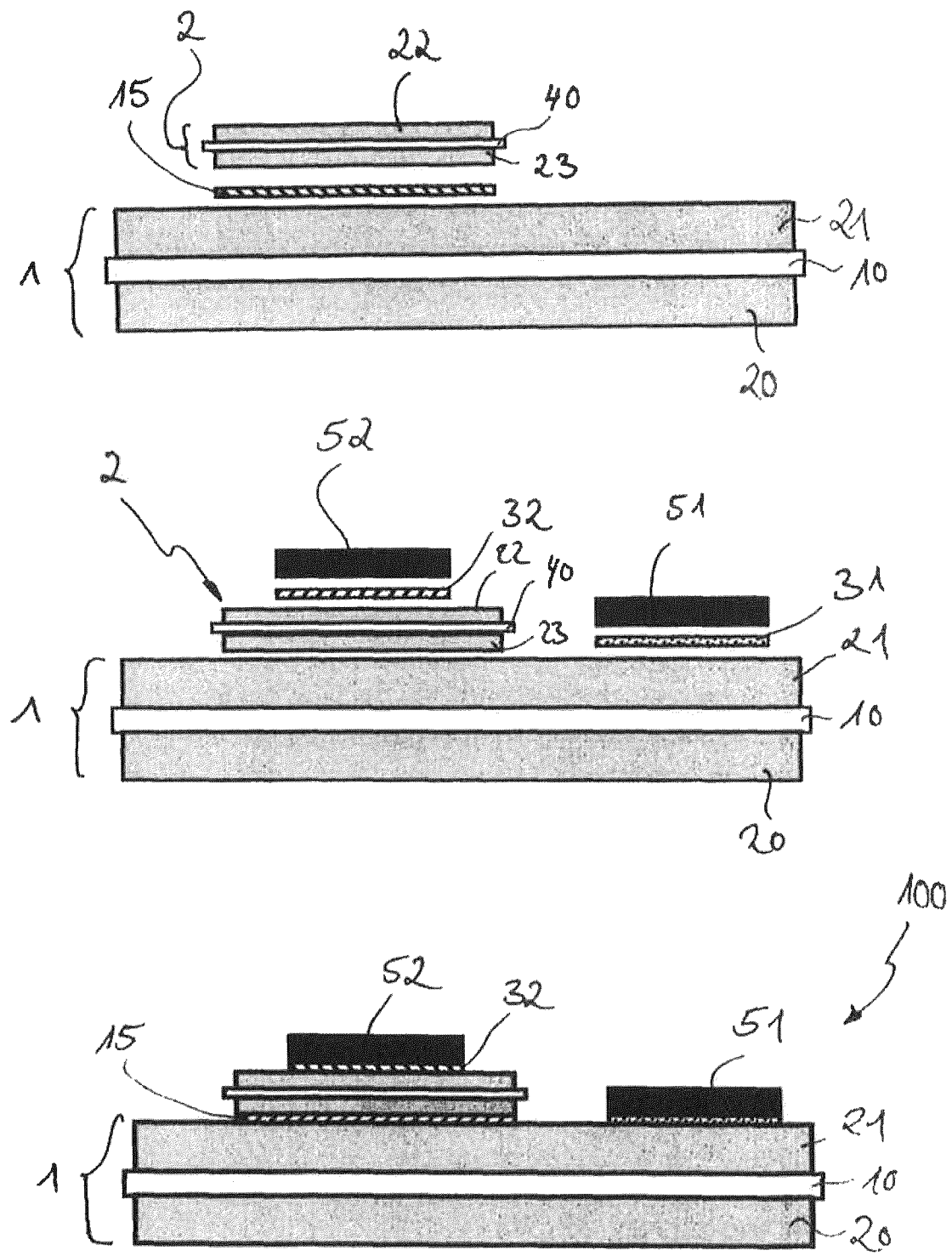
FIG. 1 schematically shows an exploded view of an electronics module according to a first example embodiment of the present invention in a populated state and an unpopulated state, respectively, and in an assembled state.

Compared to the electronics modules known from prior art, an island-like insulation layer is provided, which especially realizes electrical insulation between the primary component metallization and the secondary component metallization. This means that it is no longer essential to form electrical lines or conductive tracks by patterning the primary component metallization, but the insulation layer can be used to arrange various electrical components so that they are electrically insulated from each other or to establish specific connections without the requirement for patterning the primary component metallization. Preferably, the insulation layer is directly connected to the primary component metallization.

Alternatively, it is conceivable that for example, the insulation layer is a portion of a further, especially smaller, metal-ceramic substrate, which in turn is placed on the larger metal-ceramic substrate serving as a carrier and is connected to the metal-ceramic substrate using a DCB or active soldering process or by means of an adhesive. In particular, the insulation layer is a comparatively thin insulation layer made of ceramic, which contributes to the electrical insulation of the secondary component metallization from the primary component metallization. It is especially intended that the electronics module or the arrangement of the primary component metallization and the secondary component metallization is not completely embedded in an encapsulation or a housing. The person skilled in the art will appreciate that the first size is a first thickness and/or a first length or width and/or area of the ceramic element and that the second size is a second thickness and/or a second length or width and/or area of the insulation layer, respectively. In this context, the insulation layer may be strip-shaped, or may have an elliptical, circular, rhombic and/or square cross-section. Preferably, the insulation layer is surrounded on all sides by the primary component metallization in a plane parallel to the main extension plane. Alternatively, it is also conceivable that the insulation layer is arranged at the edge of the primary component metallization, so that the insulation layer is surrounded by the primary component metallization on at most three or two sides in a plane extending parallel to the main extension plane.

Furthermore, it is particularly preferred that the insulation layer protrudes, especially circumferentially, from the outermost edge of the secondary component metallization, especially for the purpose of avoiding an electrical flashover between the secondary component metallization and the primary component metallization. It is preferably provided for the insulation layer to project, in particular circumferentially along an outermost edge of the insulation layer or of the secondary component metallization, in a direction parallel to the main extension plane of the metal-ceramic substrate relative to an outermost edge of the secondary component metallization, preferably by 10 μm to 500 μm, preferably by 50 μm to 250 μm and particularly preferably by 100 to 150 μm. In other words, the insulation layer is formed such that the outermost edge thereof protrudes from the secondary component metallization to form a "pullback" which prevents electrical flashover and provides complete electrical insulation of the secondary component metallization from the primary component metallization.

It is further provided for a ratio of the second thickness to the first thickness to assume a value between 0.03 and 0.8, preferably between 0.03 and 0.5, and particularly preferably between 0.03 and 0.3. For example, the second thickness has a value between 500 μm and 1 mm, preferably between 200 μm and 500 μm, and particularly preferably between 10 μm and 200 μm. It has been found that sufficient insulation strength can be achieved using comparatively thin insulation layers. The insulation layer advantageously uses the primary component metallization as a mechanical stabilization. Due to the comparatively thin second thicknesses, realization of fine patterns or separating sections between electrical components or insulation layers will advantageously be simplified.

In particular, it is advantageously possible to save on insulation material using the smallest possible insulation layer, especially using an insulation layer as thin as possible. In addition, it is possible to realize comparatively small patterns, since patterning of the insulation layer is comparatively easy. In addition, due to the suitable design having the island-like insulation layer it is possible to provide electrical modules with comparatively low parasitic inductance. Furthermore, it is advantageously possible to make optimal use of the surface of the metal-ceramic substrate to be filled with an arrangement of electrical components.

Furthermore, it is provided for the primary or secondary component metallization and/or the cooling component metallization to be directly and immediately connected to the insulation layer, for example to be connected using a DCB method, an AMB method or using a thin-film technique. Furthermore, the metal-ceramic substrate or the further metal-ceramic substrate comprises at least one metal layer, for example as a portion of the cooling component metallization or of the primary or secondary component metallization, which is materially connected to an outer side of the ceramic element or of the insulation layer, wherein the metal layer and the ceramic element extend along a main extension plane and are arranged one above the other along a stacking direction extending perpendicular to the main extension plane. As materials used for the metallization or the metal section, i.e. for the primary component metallization, the secondary component metallization, the cooling component metallization and/or a backside metallization, copper, aluminum, molybdenum and/or the alloys thereof, as well as laminates such as CuW, CuMo, CuAl, AlCu and/or CuCu are conceivable, especially a copper sandwich structure having a first copper layer and a second copper layer, wherein a grain size in the first copper layer differs from a second copper layer. Furthermore, it is preferably provided for the at least one metallization, i.e., the primary component metallization or secondary component metallization, to be surface-modified. A conceivable surface modification is, for example, sealing with a noble metal, especially silver and/or gold, or ENIG ("electroless nickel immersion gold") or edge grouting at the first or second metallization layer to suppress crack formation or crack expansion.

Preferably, the ceramic element and/or the insulation layer comprises at least one ceramic layer, wherein the ceramic layer comprises $Al_2O_3$, $Si_3N_4$, AlN, any HPSX ceramic (i.e., a ceramic including a matrix of $Al_2O_3$ comprising an x-percentage of $ZrO_2$, for example $Al_2O_3$ with 9% $ZrO_2$=HPS9 or $Al_2O_3$ with 25% $ZrO_2$=HPS25), SiC, BeO, MgO, high-density MgO (>90% of the theoretical density), TSZ (tetragonally stabilized zirconium oxide) or ZTA. It is also conceivable that the insulation layer or the ceramic element is designed as a composite or hybrid ceramic in which several ceramic layers, which differ in terms of their material composition, are arranged on top of each other and connected with each other to form an insulation layer for combining various desirable properties. Preferably, a ceramic material having the highest possible thermal conductivity is used for realizing the lowest possible thermal resistance. It is also conceivable that a metallic intermediate layer is arranged in the ceramic element or in the insulation layer between two ceramic layers.

In this case, the primary component metallization and/or the cooling component metallization is preferably materially connected to the insulating layer using an AMB method and/or a DCB method.

It will be appreciated by the person skilled in the art that a "DCB method" (direct copper bond technology) or a "DAB method" (direct aluminum bond technology) is a method that is used, for example, for bonding metal layers or sheets (e. g. copper sheets or foils or aluminum sheets or foils) to each other and/or with ceramics or ceramic layers, using metal or copper sheets or metal or copper foils having a layer or coating (fusion layer) on their surface sides. In this method, described for example in U.S. Pat. No. 3,744,120 A or in DE23 19 854 C2, this layer or coating (fusion layer) forms a eutectic with a melting temperature below the melting temperature of the metal (e.g. copper), so that by placing the foil on the ceramic and by heating all the layers, they can be connected to each other, namely by melting the metal or copper essentially in the region of the fusion layer or oxide layer only.

In particular, the DCB method includes, for example, the following method steps:
oxidizing a copper foil in such a way that a uniform copper oxide layer is formed;
placing the copper foil onto the ceramic layer;
heating the composite to a process temperature of between about 1025 to 1083° C., e.g., to about 1071° C.;
cooling down to room temperature.

An active solder method, e.g. for bonding metal layers or metal foils, especially also copper layers or copper foils to ceramic material, is a method which is also used specifically for the production of metal-ceramic substrates, wherein at a temperature of 600-1000° C., a bond is produced between a metal foil, for example a copper foil, and a ceramic substrate, for example an aluminum nitride ceramic, using a hard solder which, in addition to a main component such as copper, silver and/or gold, also contains an active metal. This active metal, which is for example at least one element selected from the group consisting of Hf, Ti, Zr, Nb, Ce, creates a bond between the solder and the ceramic by chemical reaction, while the bond between the solder and the metal is a metallic brazed joint. Alternatively, a thick layer method is also conceivable for connecting.

Preferably, at least one first electrical component is connected to the respective primary component metallization and at least one second electrical component is connected to the respective secondary component metallization, and especially is connected to be directly adjacent. The at least one first electrical component and the at least one second electrical component are thus electrically insulated from each other via the insulation layer.

The at least one first electrical component and/or the at least one second electrical component is preferably a switchable component or active or passive component. Preferably, this is a wide bandgap semiconducting (WBG) semiconductor, such as a semiconductor made of silicon carbide, gallium nitride and/or indium gallium nitride. Examples of an electronic component are MOSFETs ("metal-oxide-semiconducting field-effect transistor") or IGBTs ("insulated-gate bipolar transistor").

Preferably, the at least one first electrical component and the at least one second electrical component are connected to each other via a wire bond. This advantageously allows realizing electrical connection between the at least one electrical component and the at least one second electrical component, especially without resorting to the primary component metallization of the metal-ceramic substrate. In other words, connection via the wire bond replaces a conducting track that would otherwise be required and which is created by patterning the primary component metallization.

In particular, it is provided for the primary component metallization to be electrically conductively connected to the secondary component metallization via through-plating or sideplating. For example, it is provided for a recess to be integrated into the insulation layer, which is filled with an electrically conductive medium, especially the metal of the secondary component metallization, during formation of the secondary component metallization. Alternatively, it is conceivable that during formation of the secondary component metallization a section projecting beyond an outermost edge in a direction parallel to the main extension plane is left standing, i.e., is not removed during patterning of the secondary component metallization. In other words, the secondary component metallization protrudes or overhangs the outermost edge of the insulation layer, at least in sections. As a result, the secondary component metallization extends around the insulation layer, thus forming sideplating that overlaps or bypasses the insulation layer at its outermost edge and establishes a connection to the primary component metallization.

Preferably, it is provided for the primary component metallization of the metal-ceramic substrate to be unpatterned and/or to be free of patterning extending to the ceramic element. This advantageously allows omitting an otherwise expensive etching process, especially an etching process in which the boundary layer between the ceramic element and the primary component metallization has to be etched away during a "second etching". Basically, it is advantageously possible to omit multiple patterning or to eliminate a large proportion of the patterning in the primary component metallization, as a result of which the primary component metallization is improved in terms of heat dissipation capability or heat transport, since the number of free surface areas in the primary component metallization is reduced compared with conventional component metallizations, and the primary component metallization may optimally be designed for heat dissipation.

Alternatively, it is conceivable that the primary component metallization is patterned. By "patterned" it is to be understood especially that the primary component metallization extends to the ceramic element. For example, this free surface area, i.e., an insulation trench formed by the patterning, can be filled at least in part, preferably completely or in layers, with the insulation layer and/or with another insulation layer and/or a filling compound, in particular an electrically insulating filling compound. Especially, when making use of the filling compound, it is provided for the insulation layer to bridge the isolation trench formed and the filling compound to support or carry the insulation layer. For example, the filling compound is a plastic material or a resin. Similarly, the patterning allows further separation of metal sections, especially in a plane parallel to the main extension plane, in addition to the separation via the insulation layer in a direction perpendicular to the main extension plane.

Preferably, it is provided for at least one recess to be inserted into the primary component metallization, in which recess the island-like insulation layer and/or the secondary component metallization is arranged and/or is a first electrical component and/or a second electrical component. This allows the secondary component metallization to be advantageously arranged such that it is flush with the primary component metallization, as a result of which the connections on the primary component metallization and the secondary component metallization are located in the same plane, especially a plane extending parallel to the main extension plane. This significantly improves electrical connection, especially via wire bonds. It is also possible to reduce electrical vibrations in the electromodule using vibration damping elements, such as a snubber comprising a resistor and a capacitor. Such vibration damping element also has a beneficial effect on the inductance of the electronics module.

It is especially conceivable that the recess is dimensioned such that, in the assembled state, the at least one first electrical component and/or the at least one second electrical component is arranged below a top surface of the primary component metallization or, in the assembled state, is arranged such that the top surface of the primary component metallization is flush with a top surface of the at least one first electrical component and/or the at least one second electrical component. Advantageously, this permits to easily establish an electrical connection through the top surface of the at least one first electrical component and/or the at least one second electrical component. It is also conceivable that the electronics module comprises an encapsulation in which the metal-ceramic substrate with the insulation layer and the second component metallization is embedded. In particular, the recess can form a form fit with the encapsulation. Furthermore, it is conceivable that through-platings are integrated into the encapsulation in order to be able to drive, for example, the first electrical component, the second electrical component and/or the third electrical component via an external metallization on the encapsulation.

For example, the recess has a depth in the stacking direction of between 50 µm and 800 µm, preferably between 70 µm and 600 µm, and particularly preferably between 100 µm and 400 µm. This means that the majority of common electrical components, such as chips, can be integrated or recessed in the recess. It is also conceivable that the depth assumes a value that is less than 150 µm, preferably less than 100 µm and particularly preferably less than 70 µm.

Preferably, it is provided for the secondary component metallization to be patterned forming a metal section and at least one further metal section isolated from the metal section. Preferably, it is provided for the secondary component metallization to be thinner than the primary component metallization, since the primary component metallization can be used predominantly for dissipating heat, while the secondary component metallization is preferably provided for insulating metal sections from each other. Preferably, the primary component metallization is more than 5 times, preferably more than 10 times and especially preferably more than 20 times as thick as the secondary component metallization. This allows, for example, multiple second electrical components and/or at least one third electrical component to be connected to the insulation layer or to the secondary component metallization, respectively.

Another object of the present invention is a method of producing an electronics module, especially an electronics module according to the invention, comprising:—
  providing a metal-ceramic substrate having a ceramic element and a primary component metallization and preferably a cooling component metallization,
  forming an island-like insulation layer on the primary component metallization, wherein the ceramic element has a first size and the insulation layer has a second size, wherein the formed island-like insulation layer on the primary component metallization is dimensioned such that a ratio of the second size to the first size assumes a value that is smaller than 0.8, preferably smaller than 0.6, and more preferably smaller than 0.5, and
  forming a secondary component metallization on the island-like insulation layer.

All advantages and features described for the electronics module analogously apply to the method and vice versa.

Preferably it is provided, for forming an island-like insulation layer, that
  a layer, especially a continuous layer made of insulation material is connected to the primary component metallization, and the connected layer of the insulation material is patterned and/or
  insulation material is patterned onto the primary component metallization using a masking. Preferably, the insulation material is a ceramics-containing insulation material. For example, patterning is performed using a laser or is performed as part of an etching process or a milling process. In the context of application using masking, it is conceivable, for example, that the insulation material is applied to the primary component metallization using a deposition process, especially sputtering or a gas phase deposition process. This enables production of comparatively thin insulation layers which have an insulating effect and can be applied, especially in a material-saving manner.

Preferably, it is provided for a layer of a metal material to be connected to a pre-composite comprising the metal-ceramic substrate and the island-like insulation layer, wherein the layer of the metal material connected to the precomposite is patterned to form the secondary component metallization. For example, it is conceivable that a secondary initial component metallization having a thickness of a few micrometers only, especially up to 30 µm, is produced in the course of a gaseous phase deposition process. By a subsequent enlargement of this secondary initial component metallization, it is possible to realize a secondary pre-component metallization which has a thickness greater than the secondary initial component metallization. For example, increasing the thickness of the metallization is performed as part of an electroplating or electrochemical process. Both the secondary initial component metallization and the secondary pre-component metallization has full-surface extent or extend over a major part of the extent of the outer side of the primary component metallization and the insulation layer. In particular, the insulation layer will be coated in a full-surface covering manner following formation of the secondary pre-component metallization. For electrical insulation of the subsequent component metallization, it is provided for the patterning of the component metallization or the secondary component metallization to be performed, in the course of an etching process, a milling process or in the course of a process in which the metal is removed by using a laser, especially with the removal of the component metallization, which takes place in the course of the formation of the secondary initial component metallization and the secondary pre-component metallization.

Further preferably, it is provided for at least a first electrical component to be connected to the primary component metallization and at least a second electrical component to be connected to the secondary component metallization, wherein preferably
  the at least one first component and/or the primary component metallization and
  the at least one second electrical component and/or the secondary component metallization are electrically conductively connected to each other via a wire bond. In this way, it is advantageously possible to replace the conducting track usually provided for connecting the at least one electrical component to the at least one second electrical component using wire bonds connection. This could prove to be advantageous especially during manufacture and population of the electronics modules.

Further advantages and features will be apparent from the following description of preferred while making reference to the accompanying figures. FIG. 1 is a schematic exploded view of an electronics module 100 according to a first exemplary embodiment of the present invention, in an unpopulated state (top) and a populated state (center) as well as in a composite state (bottom). Such electronics modules 100, especially power electronics modules, are comprised of a metal-ceramic substrate 1 as a carrier for at least a first electrical component 51. The metal-ceramic substrate 1 serving as a carrier comprises a ceramic element 10 to which a primary component metallization 21 and a cooling component metallization 20 are connected on opposite sides. Preferably, the primary component metallization 21 and the cooling component metallization 20 are connected to the ceramic element 10 using a DAB or DCB method, i.e., a direct connection method, or by an active soldering method. The at least one electrical component 51 can be connected to the metal-ceramic substrate 1, for example, via a first solder material 31. For example, the at least one first electrical component 51 may be a chip or a microprocessor.

Typically, in the prior art, it is provided for structuring the primary component metallization 21 to arrange the at least one electrical component 51 electrically isolated from at least one second electronic component 52 on the metal-ceramic substrate 1. However, in the present embodiment of the present invention, it is provided for an insulation layer 40 to electrically insulate the at least one first electrical component 51 from the at least one second electrical component 52. In the example embodiment shown in FIG. 1, the insulation layer 40 forms part of a further metal-ceramic substrate 2 which is smaller in size compared to the metal-ceramic substrate 1 serving as the carrier. Especially, the further metal-ceramic substrate 2 is smaller than the metal-ceramic substrate 1 by a factor of 2, preferably a factor of 4, and particularly preferably by a factor of 7.5, compared to the metal-ceramic substrate 1 serving as a carrier. In addition to the insulation layer 40, the further metal-ceramic substrate 2 comprises a backside metallization 23 and a secondary component metallization 22 opposite the backside metallization 23. The further metal-ceramic substrate 2 is connected to the primary component metallization 21 via a binding layer 15. Especially the backside metallization 23 of the further metal-ceramic substrate 2 is connected to the primary component metallization 21 via the binding layer 15, wherein the binding layer 15 can be established in a DCB or DAB direct bonding method and/or using an adhesive and/or an active solder material.

Furthermore, it is particularly preferred that the at least one second electrical component 52 is connected to at least one portion of the secondary component metallization 22 via a second solder material 32. In this regard, the second solder material 32 may be the same as the first solder material 31 or may be different from the first solder material 31.

In particular, the embodiment of FIG. 1 is characterized in that the ceramic element 10 of the metal-ceramic substrate 1 has a first size L1, D1 and the insulation layer 40 has a second size L2, D2, wherein, in order to form an island-like insulation layer 40 on the primary component metallization 21, a ratio of the second size L2, D2 to the first size L1, D1 assumes a value which is smaller than 0.8, preferably smaller than 0.6 and particularly preferably smaller than 0.4. In particular, it is provided that the insulation layer 40 prevents the at least one first electrical component 51 from being electrically conductively connected to the at least one second electrical component 52 via the primary component metallization 21. In this context, the person skilled in the art considers a first quantity L1, D2 to be a first length L1 dimensioned along a main extension plane HSE of the metal-ceramic substrate 1 and/or a first thickness D1 of the ceramic element 10 dimensioned perpendicular to the main extension plane HSE, and a second quantity L2, D2 to be a second length L2 dimensioned parallel to the main extension plane HSE and/or a second thickness D2 dimensioned perpendicular to the main extension plane HSE. Preferably, the second thickness D2 of the insulation layer 40 is to be smaller than the first thickness D1 of the ceramic element 10. For example, the second thickness D2 is smaller than 0.8 times the first thickness D1, preferably smaller than 0.5 times the first thickness D1 and particularly preferably smaller than 0.3 times the first thickness D1.

Figure 2:
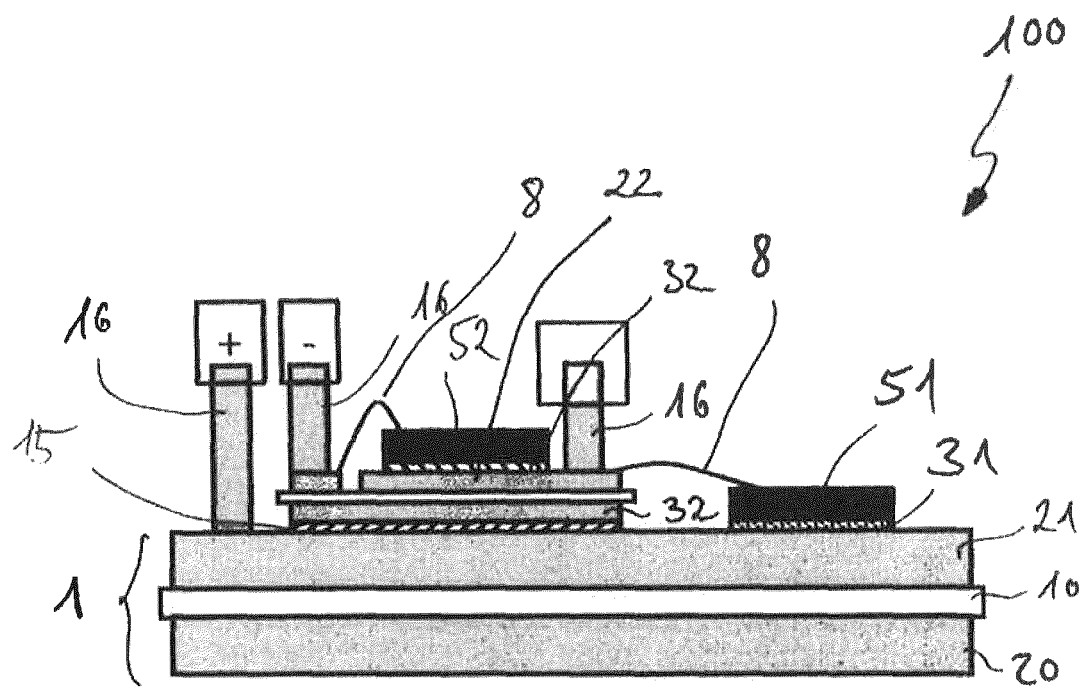
FIG. 2 schematically shows an electronics module according to a second example embodiment of the present invention, FIG. 3 schematically shows an electronics module according to a third example embodiment of the present invention, FIG. 4 schematically shows an electronics module according to a fourth example embodiment of the present invention, FIG. 5 schematically shows an electronics module according to a fifth example embodiment of the present invention, FIGS. 6a, 6b, 6c, 6d, 6e, and 6f schematically illustrate a method of producing an electronics module according to a first example embodiment of the present invention, FIGS. 7a, 7b, 7c, 7d, and 7e schematically illustrate a method of producing an electronics module according to a second example embodiment of the present invention, FIGS. 8a, 8b, 8c, 8d, 8e, and 8f schematically illustrate a method of producing an electronics module according to a third example embodiment of the present invention, FIGS. 9a, 9b, 9c, 9d, 9e, and 9f schematically illustrate a method of producing an electronics module according to a fourth example embodiment of the present invention, FIGS. 10a, 10b, 10c, 10d, 10e, and 10f schematically illustrate a method of producing an electronics module according to a fifth example embodiment of the present invention, and FIGS. 11a, 11b, 11c, 11d, 11e, and 11f schematically illustrate a method of producing an electronics module according to a sixth example embodiment of the present invention.

FIG. 2 shows an electronics module 100 according to a second example embodiment of the present invention. Essentially, the embodiment of FIG. 2 is complementary to that of FIG. 1 in that the at least one first electrical component 51 is electrically conductively connected to the secondary component metallization 22 via a wire bond 8. In other words, instead of establishing the electrical connection between the at least one first electrical component 51 and the at least one second electrical component 52 via the primary component metallization 21, herein it is provided for a wire bond 8 to generate the connection between the at least one first electrical component 51 and the at least one second electrical component 52, the second electrical component 52 being electrically insulated from the primary component metallization 21 via the insulation layer 40. Preferably, the secondary component metallization 22 is to be patterned, especially such that separate and especially electrically insulated metal sections will be formed on the secondary component metallization 22. Furthermore, it is particularly preferred for the electronics module 100 to have terminal lugs 16 and/or electrical contact means used to establish electrical contact with the primary component metallization 21 and/or secondary component metallization 22. For example, in the example embodiment shown in FIG. 2, one terminal lug 16 is for connecting a positive pole to the primary component metallization 21, while another terminal lug 16 is for connecting a negative pole to the secondary component metallization 22, and furthermore an additional terminal including a terminal lug 16 is provided, where an output signal can be sensed. Furthermore, it is conceivable that different metal sections of the secondary component metallization 22 are also connected to each other via a wire bond 8 or an additional wire bond 8.

Figure 3:
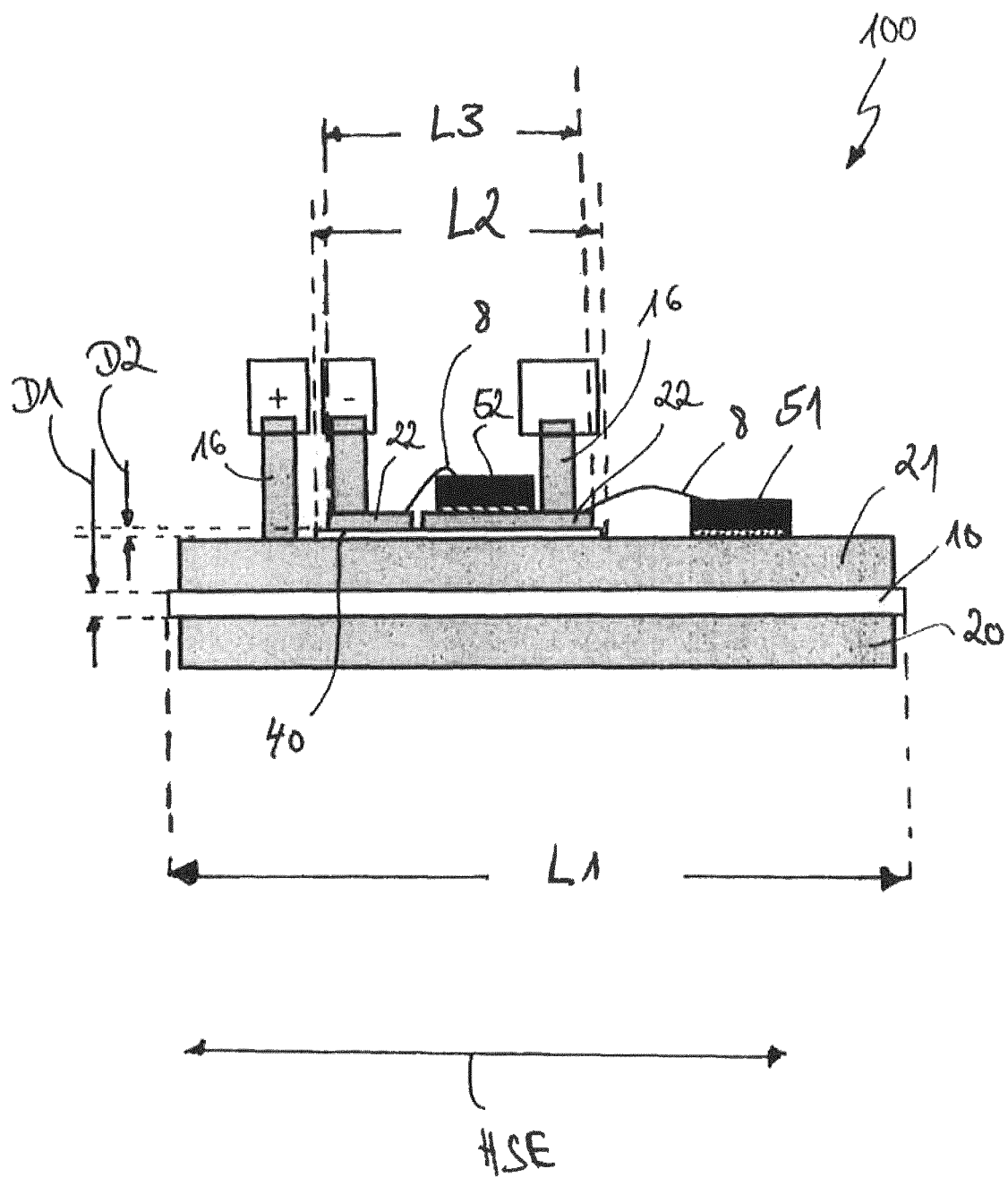

FIG. 3 illustrates a third example embodiment of the present invention. In particular, the embodiment of FIG. 3 differs from those of FIGS. 1 and 2 in that the insulation layer 40 is directly connected to the primary component metallization 21 instead of being indirectly connected via the backside metallization 23 of the further metal-ceramic substrate 2. This advantageously eliminates the need for the backside metallization 23 of the embodiments of FIGS. 1 and 2. Furthermore, it is provided for the insulation layer 40 to have a second thickness D2 and the ceramic element 10 to have a first thickness D1, wherein a ratio of the second thickness D2 to the first thickness D1 assumes a value between 0.03 and 0.8, preferably between 0.03 and 0.5 and particularly preferably between 0.03 and 0.3. For example, the second thickness D2 has a value of between 500 µm and 1 mm, preferably between 200 µm and 500 µm and particularly preferably between 10 µm and 200 µm.

It is furthermore provided for the insulation layer 40 to have a second length L2 dimensioned along the main extension plane HSE of the metal-ceramic substrate 1 and the secondary component metallization 22 to have a third length L3 dimensioned along the main extension plane HSE, wherein the second length L2 is smaller than the third length L3. In particular, a ratio of the second length L2 to the third length L3 assumes a value between 0.7 and 0.9, preferably between 0.75 and 0.85, and particularly preferably between 0.78 and 0.82. Preferably, it is provided for the secondary component metallization 22 to be set back in relation to an outermost edge of the insulation layer 40 in the direction of the main extension plane HSE, especially circumferentially for the entire island-like insulation layer 40. This especially generates a circumferential protrusion of the insulation layer 40 in relation to the secondary component metallization 22, which especially prevents electrical flashover between the secondary component metallization 22 and the primary component metallization 21, especially in the case of comparatively thin layers or layer thicknesses of the insulation layer 40, i.e., in comparison to comparatively thin second thicknesses D2. Furthermore, it is conceivable that the primary component metallization 21 is free of patterning extending to the ceramic element 10. Furthermore, it is provided for the metal-ceramic substrate 1 to have a first length L1 dimensioned parallel to the main extension plane HSE, wherein a ratio of the second length L2 to the first length L1 assumes a value which is smaller than 0.8, preferably smaller than 0.6 and particularly preferably smaller than 0.4.

Figure 4:
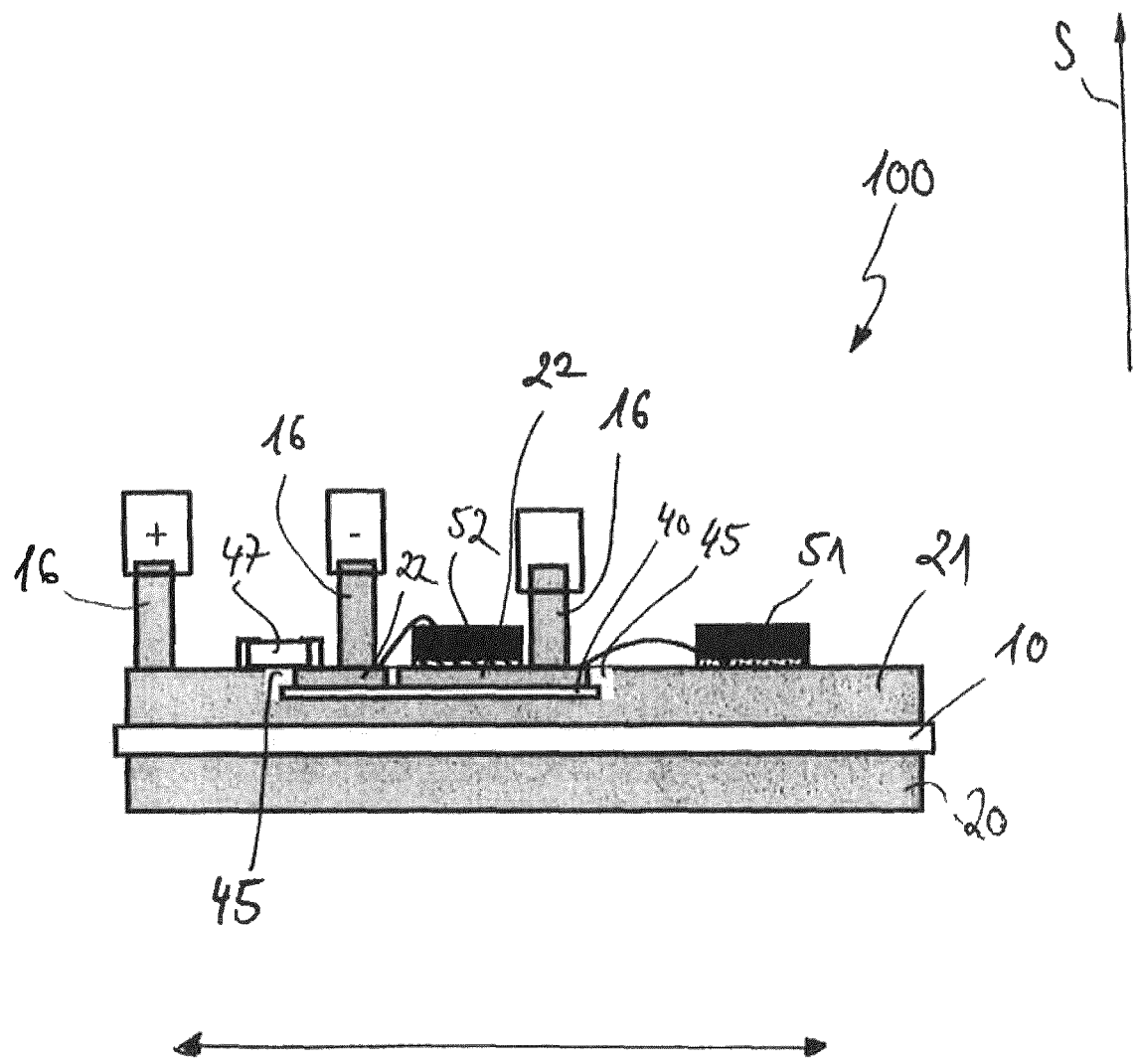

FIG. 4 shows an electronics module 100 according to a fourth preferred embodiment of the present invention. In particular, the example embodiment of FIG. 4 differs from the previous ones by the fact that the primary component metallization 21 has a recessed course, i.e., forming at least one recess 45, into which in turn the insulation layer 40 is recessed or within which the insulation layer 40 is arranged or formed. By inserting the insulation layer 40, especially with the secondary component metallization 22 into the recess 45, flush termination along a stacking direction S running perpendicular to the main extension plane HSE between the primary component metallization 21 and the secondary component metallization 22 is advantageously realized, so that a flat surface is provided by the primary component metallization 21 and the secondary component metallization 22, especially by the respective sides facing away from the ceramic element 10.

This creates a joint connection plane, which advantageously makes it easier to realize connections between the primary component metallization 21 and the secondary component metallization 22 or between the at least one first electrical component 51 and the at least one second electrical component 52. It is also conceivable that a device is provided for attenuating undesired electrical oscillations between the primary component metallization 21 and the secondary component metallization 22. For example, this is a snubber 47. In particular, such snubbers 47 are provided for damping electrical vibrations between the primary component metallization 21 and the secondary component metallization 22. Advantageously, it is possible, for example, to arrange the snubber 47 on the jointly provided connection plane of the primary component metallization 21 and the secondary component metallization 22.

Figure 5:
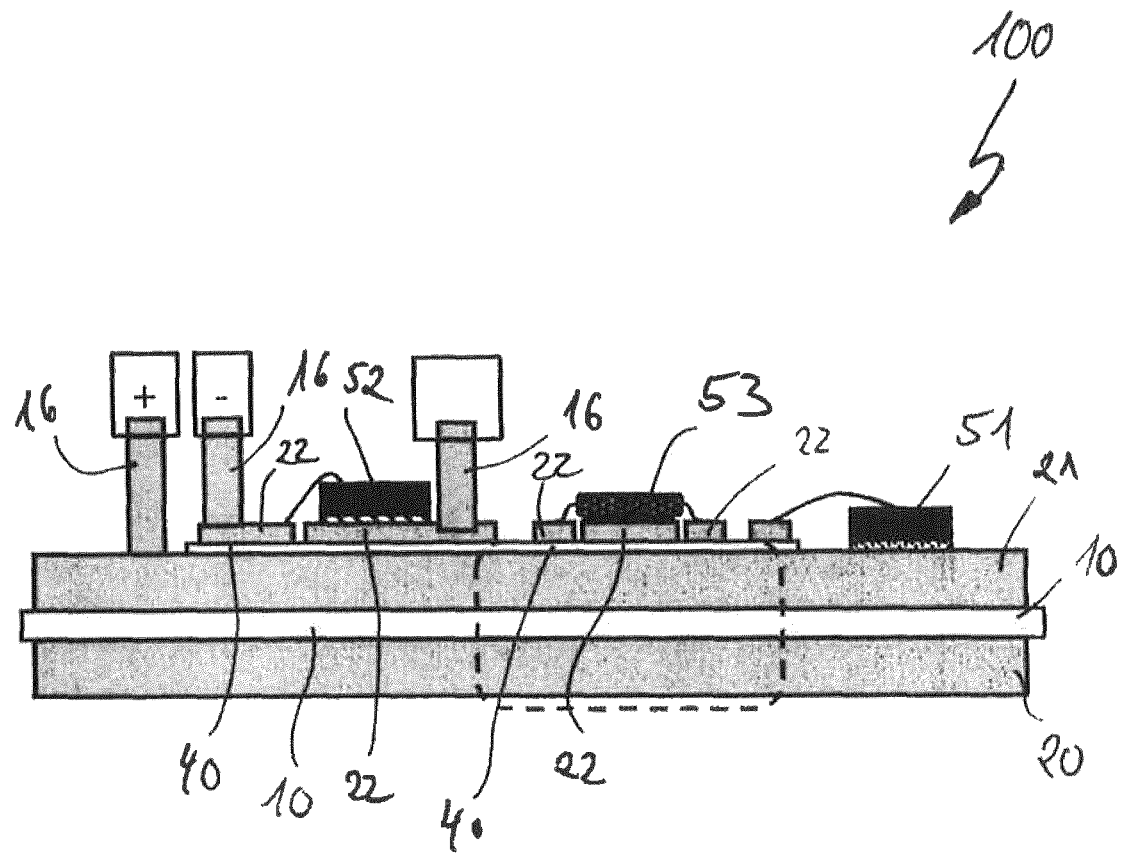

FIG. 5 shows an electronics module 100 according to a fifth example embodiment of the present invention. In particular, in this embodiment, the insulation layer 40 carries at least one third electrical component 53 in addition to the at least one second electrical component 52. This may be, for example, a passive or active SMD component. In particular, it is provided for the area below the electrical component 53 to spread heat from other components, i.e., for example, for the first electrical component 51 and second electrical component 52. The insulation layer 40 allows to populate this area with the third electrical component 53, especially if a comparatively small amount of heat arises from the third electrical component 53. In this way, the top surface of the metal-ceramic substrate 1 serving as carrier is used for population in a manner as comprehensive and optimal as possible.

Figure 6A:
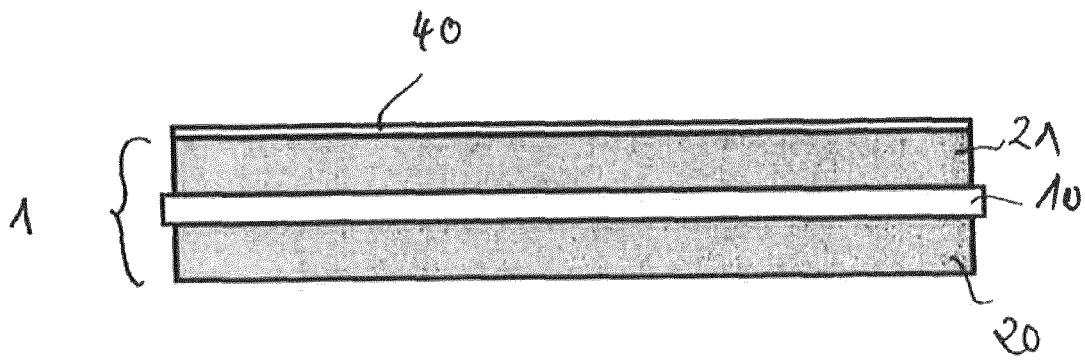
Figure 6B:
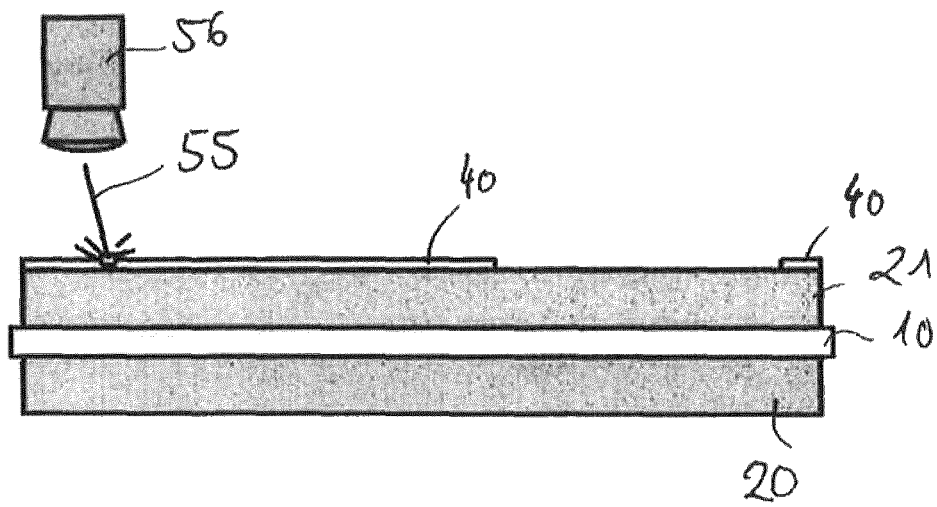
Figure 6C:
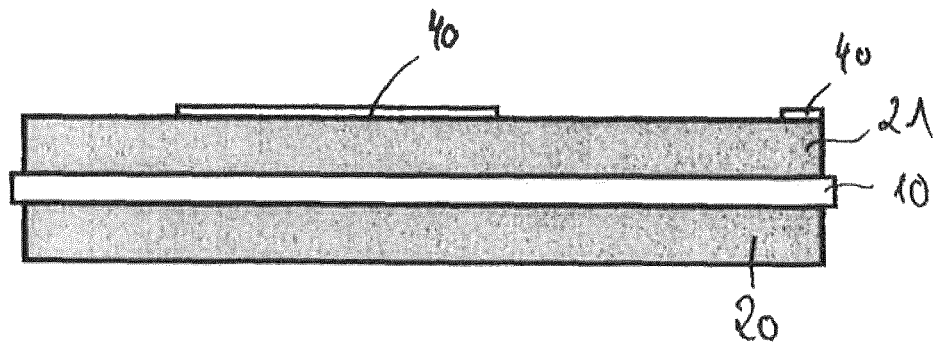
Figure 6D:
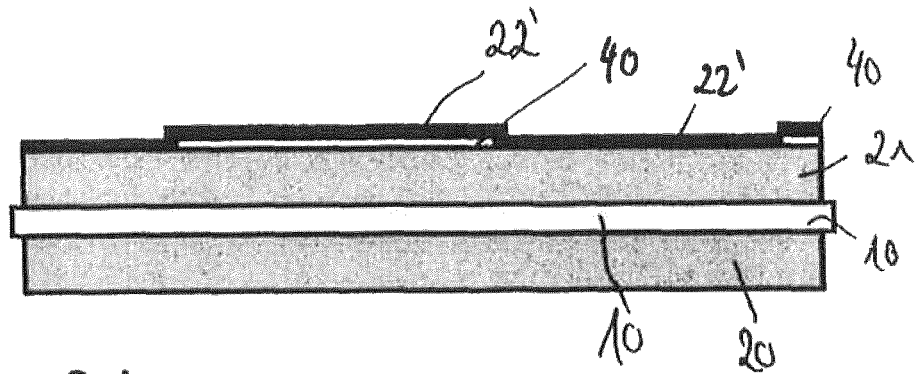

FIGS. 6a to 6f illustrate a method of producing an electronics module 100 according to a preferred embodiment of the present invention. In particular, it is provided for the metal-ceramic substrate 1 to be prepared in a step not shown. Subsequently, ceramic material is applied in the form of a thin layer to form the insulation layer 40 at least partially, preferably over the entire surface. Through targeted local removal in certain areas on the top surface of the metal-ceramic substrate 1, the full-surface insulation layer 40 is reduced to an island-like insulation layer 40, the second length L2 of which is smaller than the first length L1 of the metal-ceramic substrate 1 or of the first ceramic element 10. For example, laser light 55 provided by a laser source 56 is used to remove or partially remove the insulation layer 40 (see FIG. 6b). FIG. 6c shows the pre-composite which is free from the unneeded partial areas of the insulation layer 40. Following removal of the insulation layer 40, a secondary initial component metallization 22' is applied. In particular, this secondary initial component metallization 22' is applied as part of a deposition process, especially a chemical or physical vapor deposition process, such as sputtering, PVD, CVD, PECVD or other thin-film processes. This results in continuous, full-surface formation of the secondary initial component metallization 22' on the primary component metallization 21 and on the island-like insulation layer 40. This is illustrated in FIG. 6d.

Figure 6E:
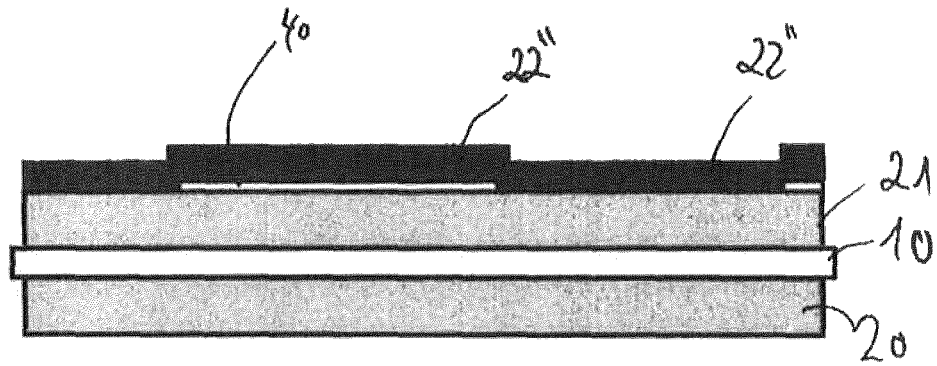

Following thin film formation of the secondary initial component metallization 22', the thickness of the secondary initial component metallization 22' is increased by an electroplating or electrochemical process, for example, to form a secondary pre-component metallization 22". The secondary pre-component metallization 22" also extends over the entire extent of the primary component metallization 21. This stage of manufacturing process is illustrated in FIG. 6e.

Figure 6F:
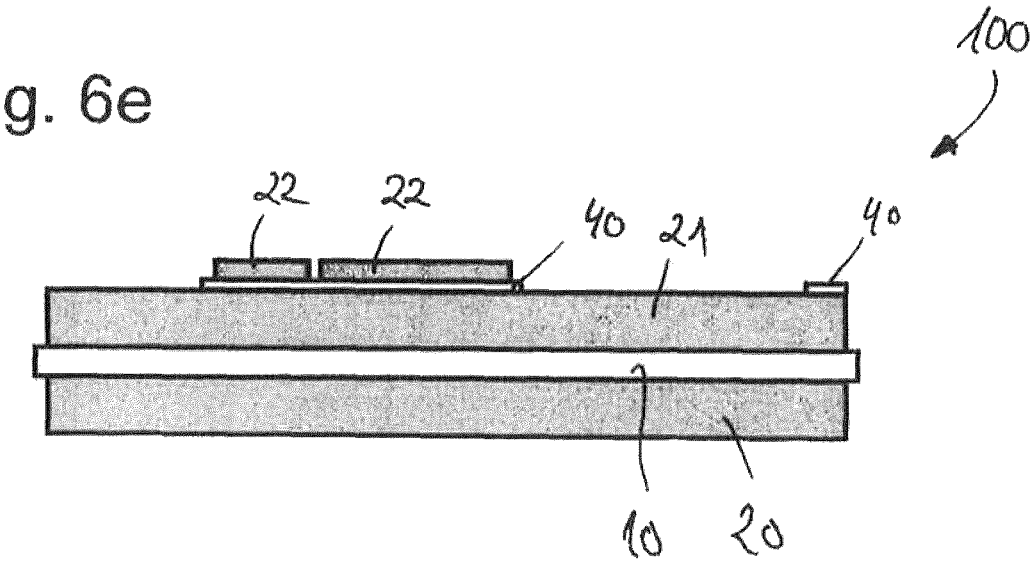
Figure 7A:
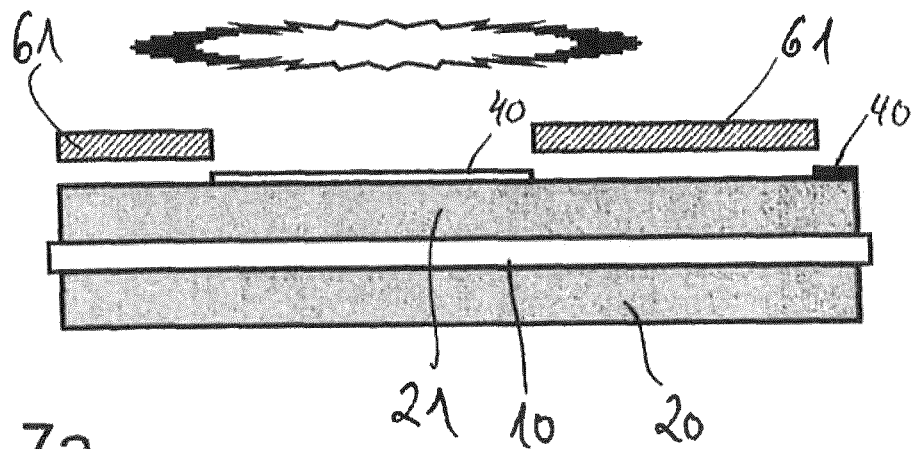
Figure 7B:
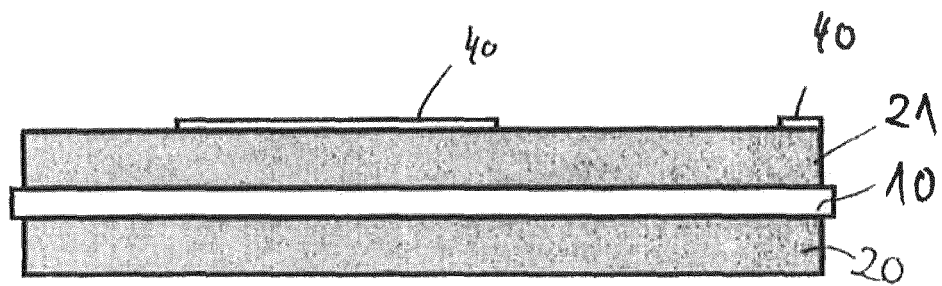
Figure 7C:
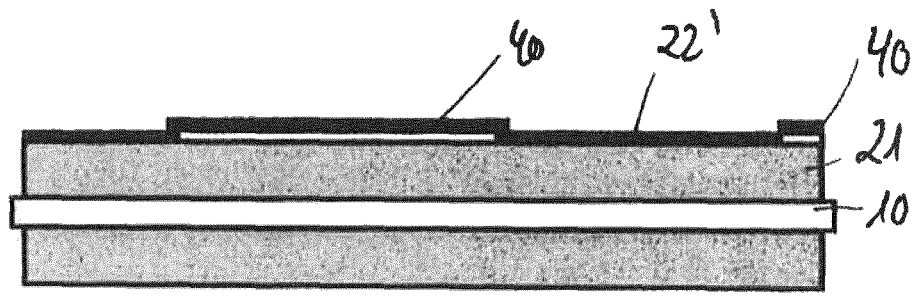
Figure 7D:
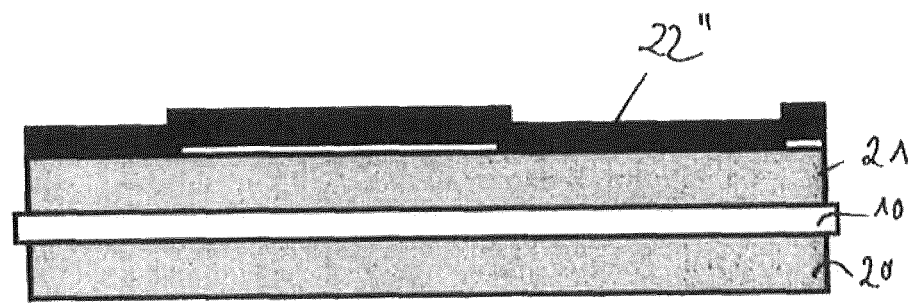
Figure 7E:
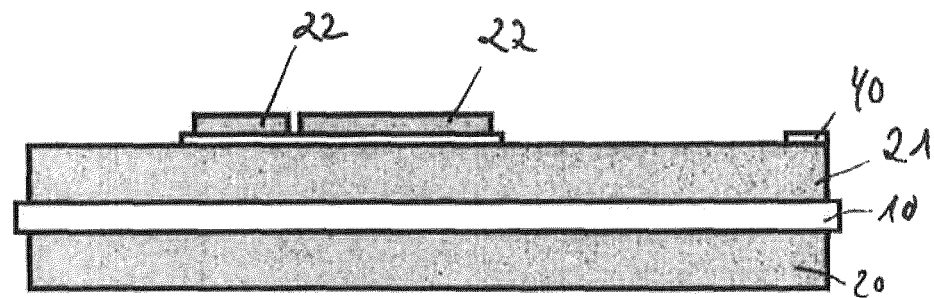
Figure 8A:
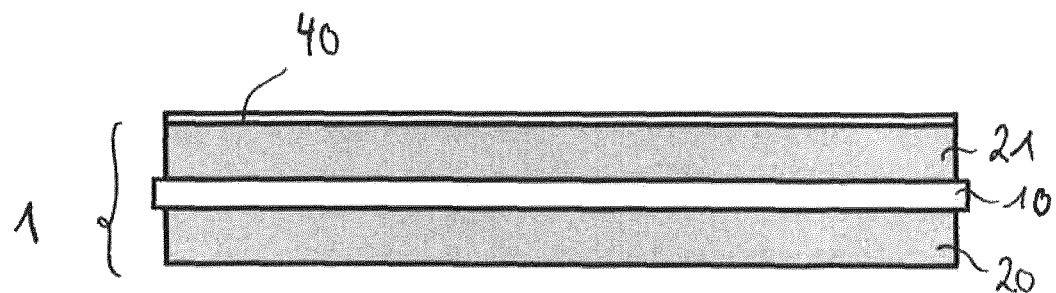
Figure 8B:
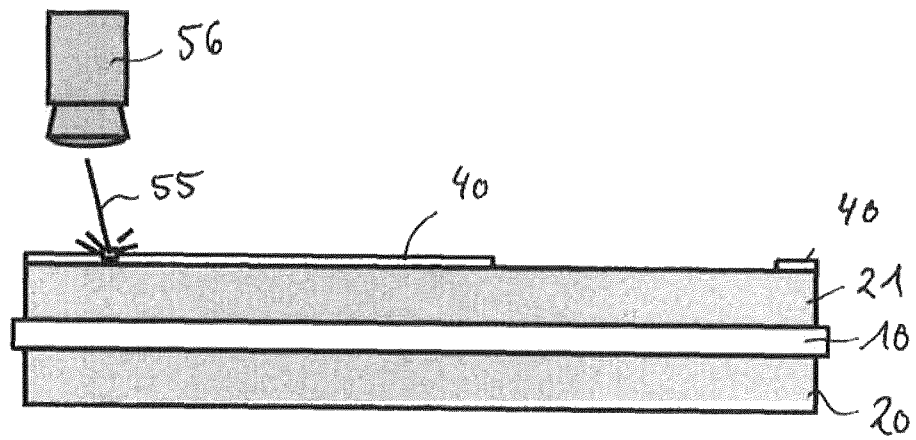
Figure 8C:
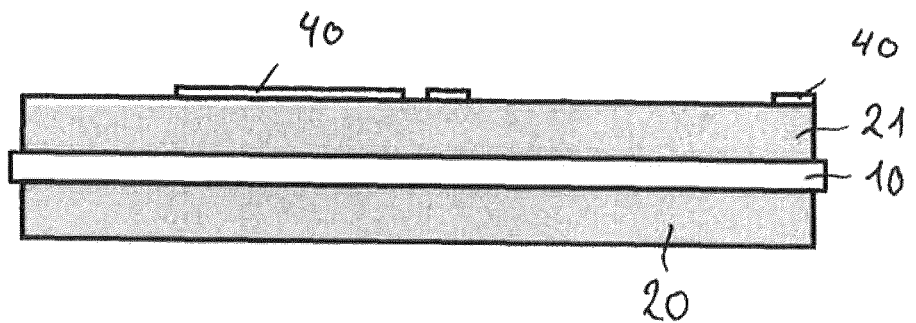
Figure 8D:
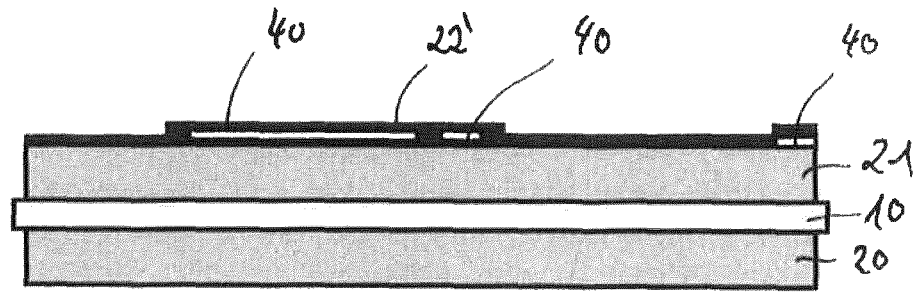
Figure 8E:
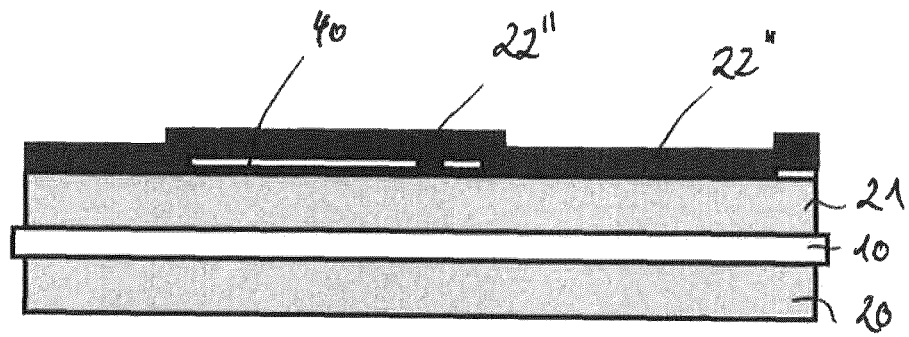
Figure 8F:
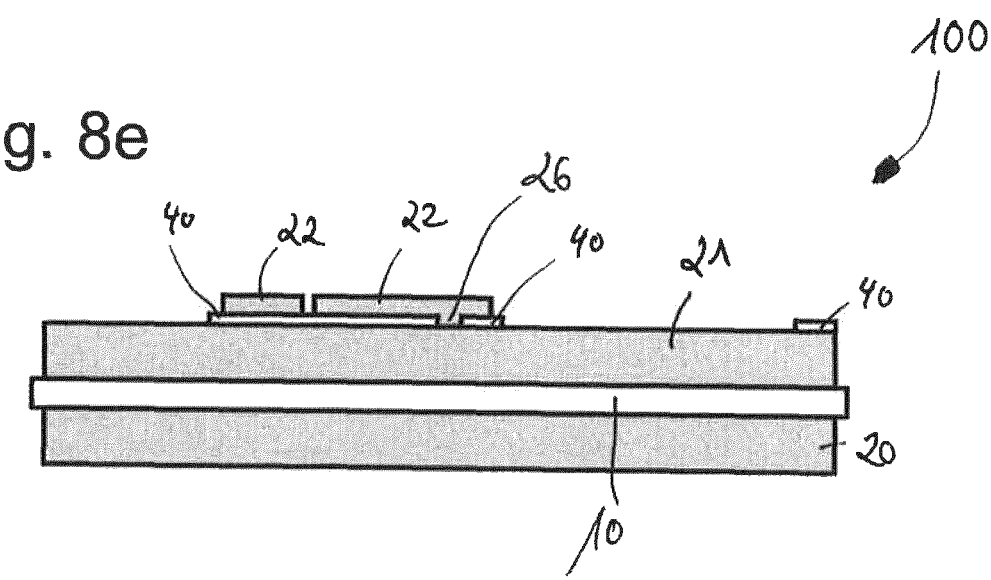
Figure 9A:
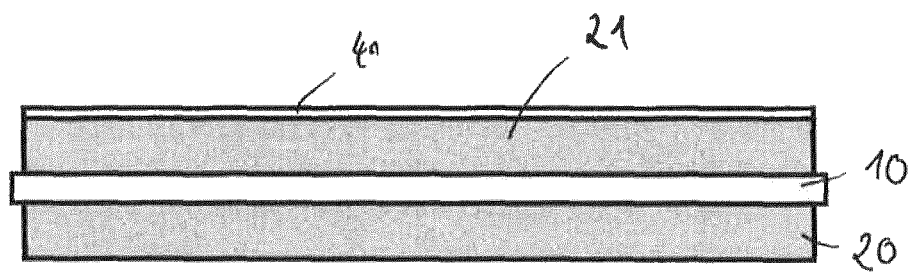
Figure 9B:
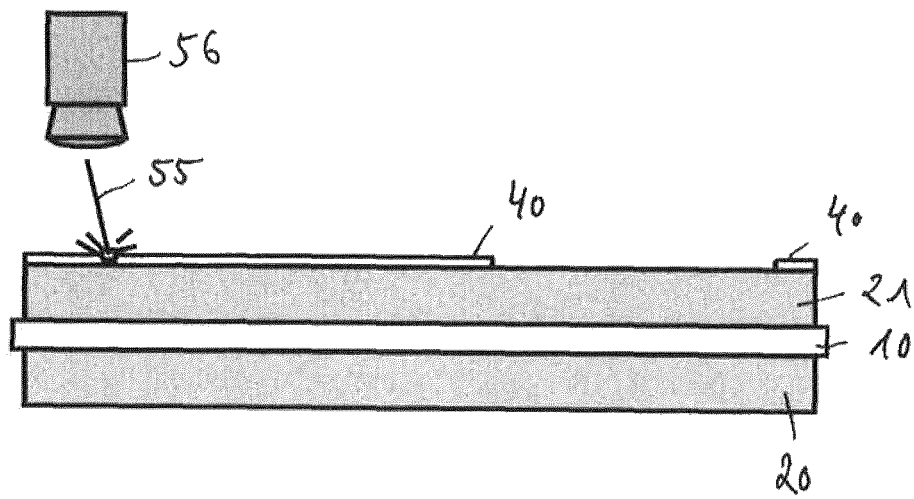
Figure 9C:
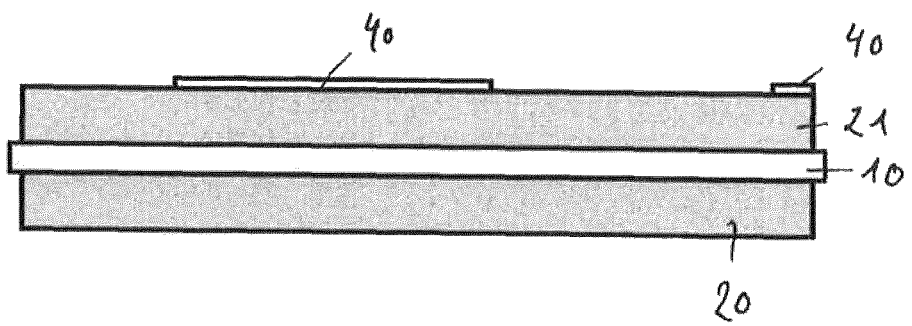
Figure 9D:
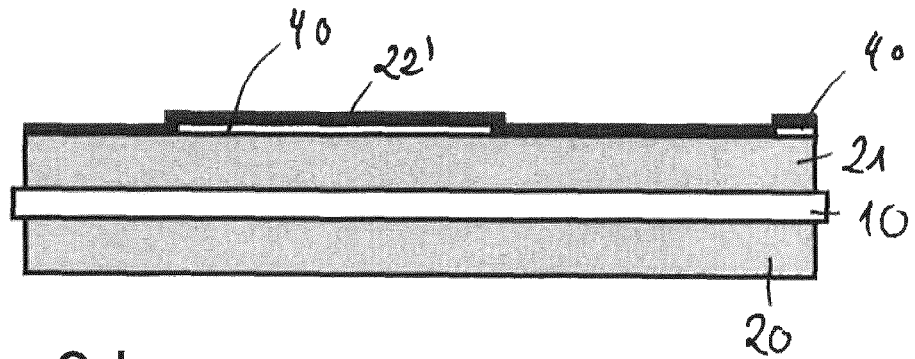
Figure 9E:
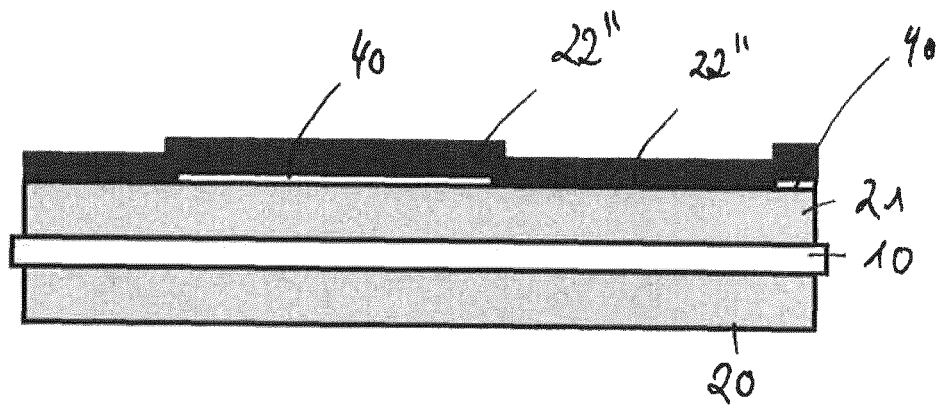
Figure 9F:
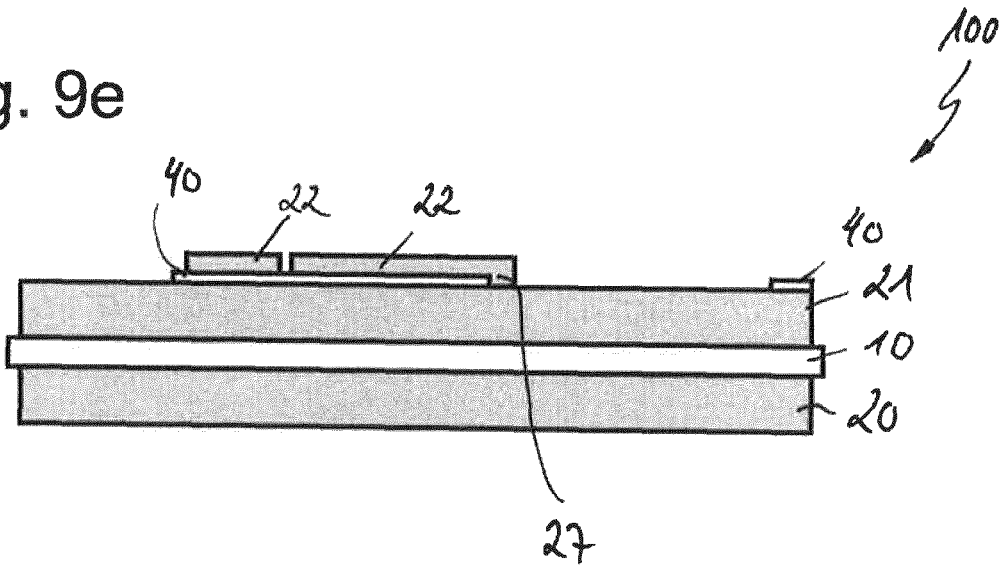
Figure 10A:
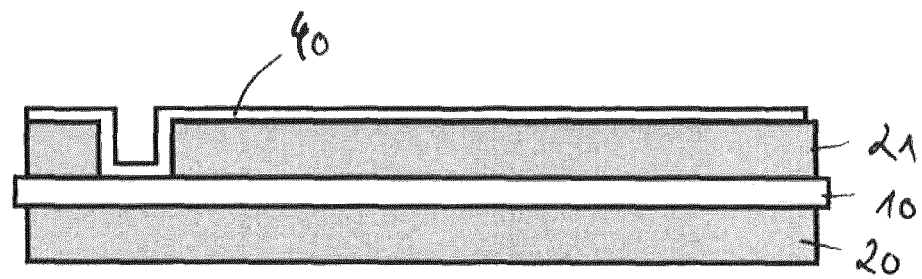
Figure 10B:
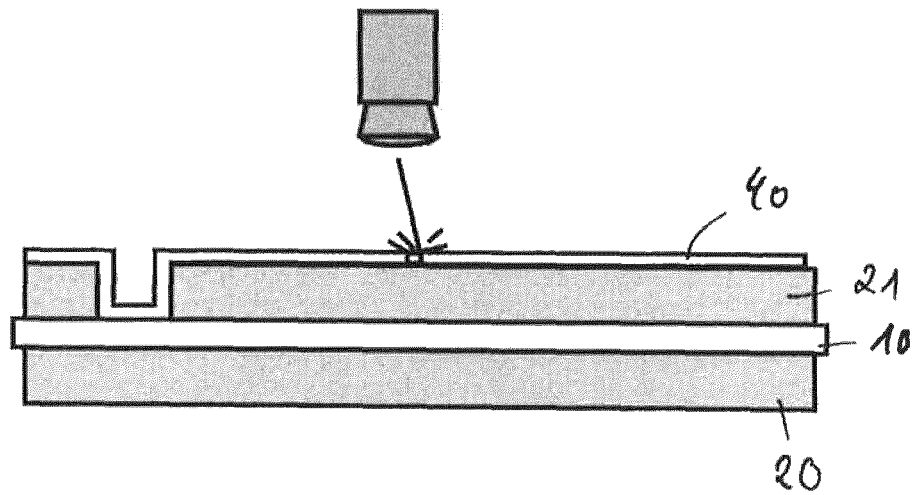
Figure 10C:
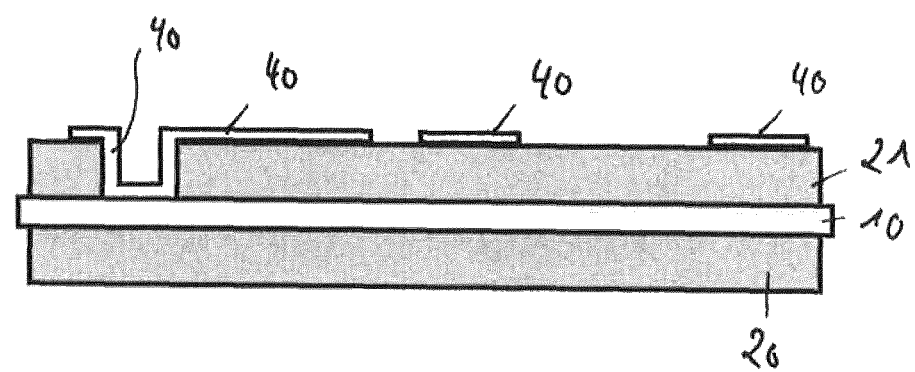
Figure 10D:
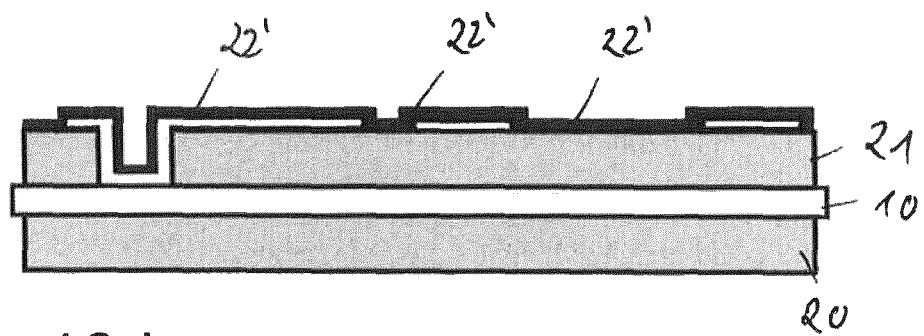
Figure 10E:
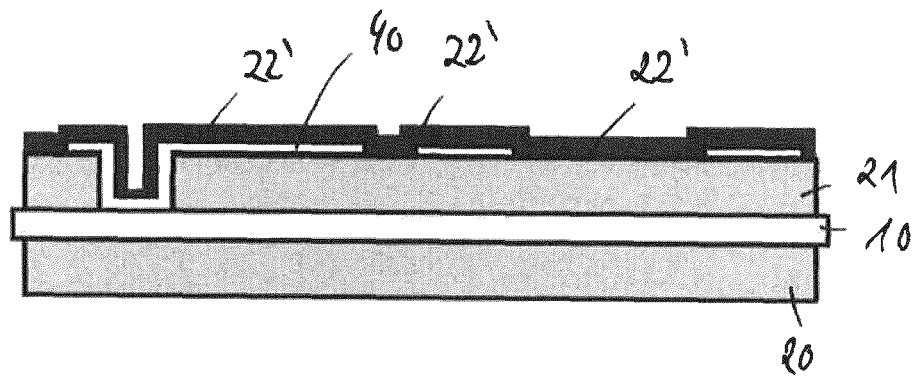
Figure 10F:
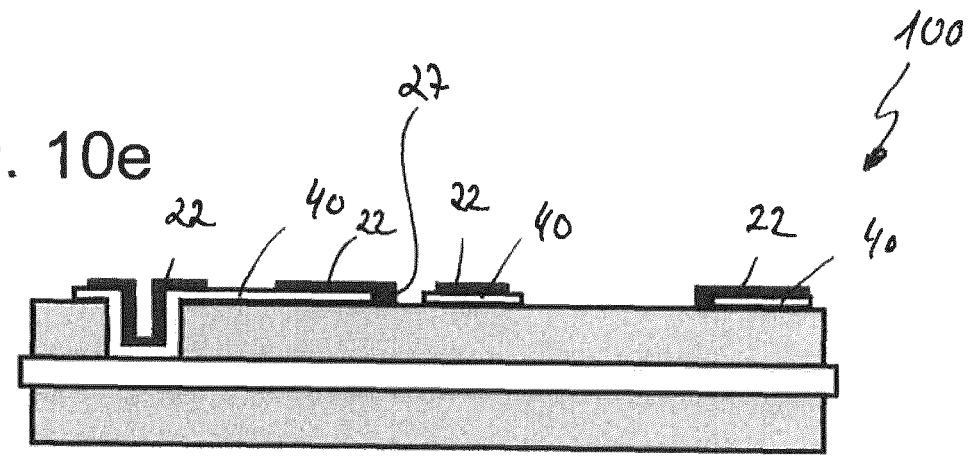
Figure 11A:
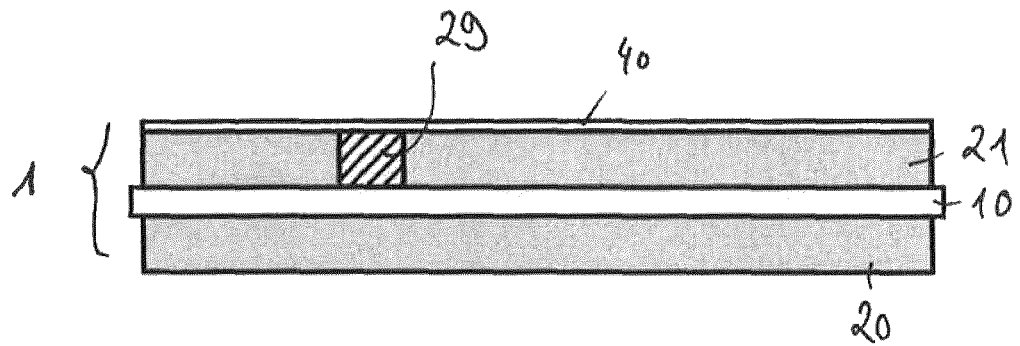
Figure 11B:
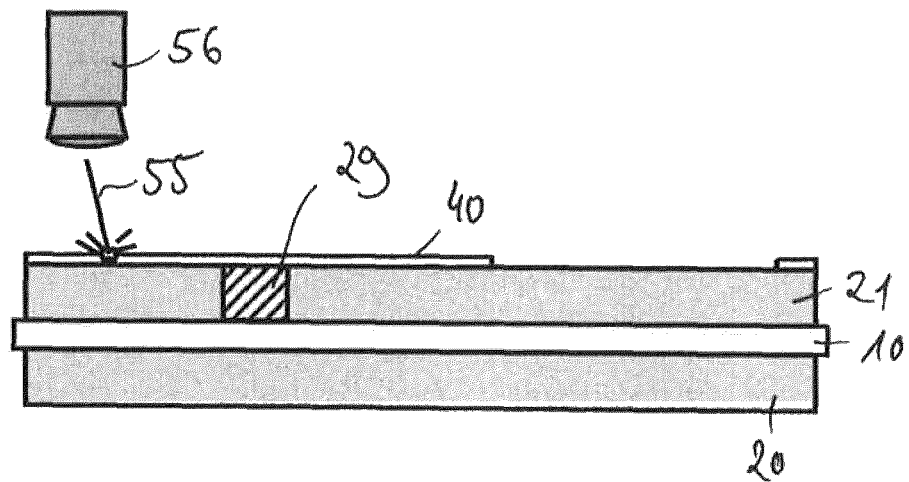
Figure 11C:
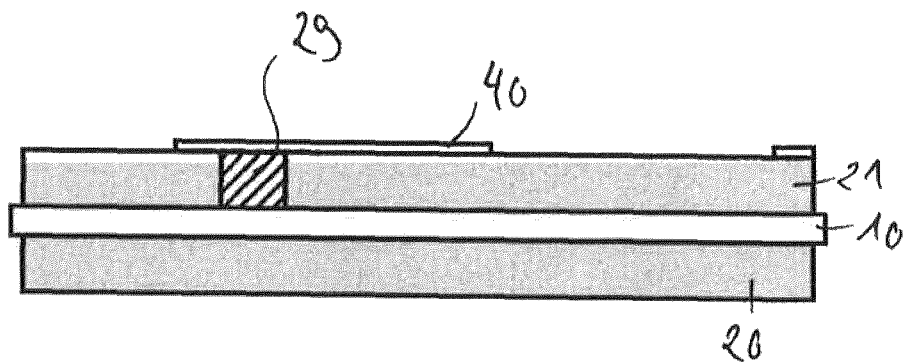
Figure 11D:
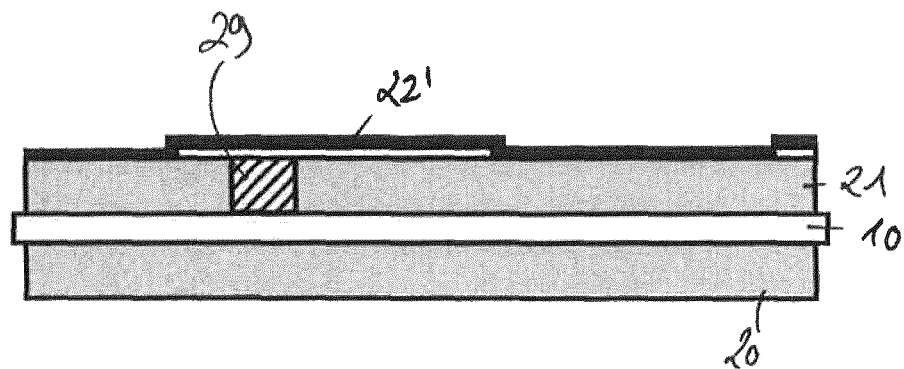
Figure 11E:
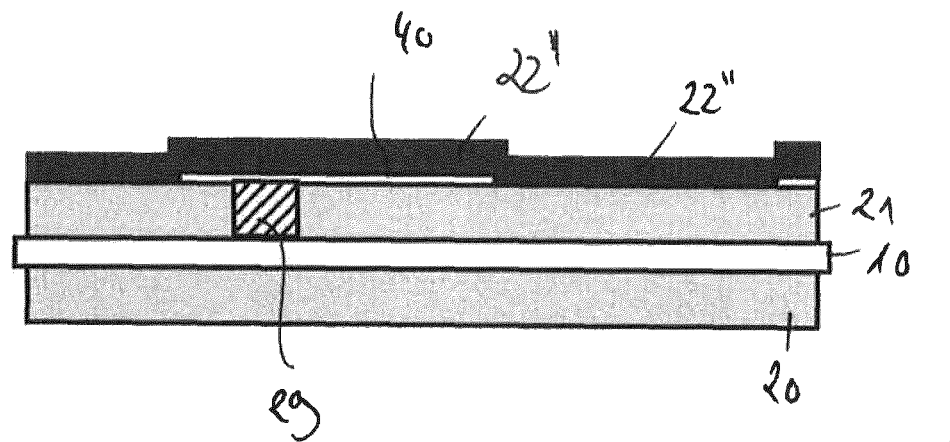
Figure 11F:
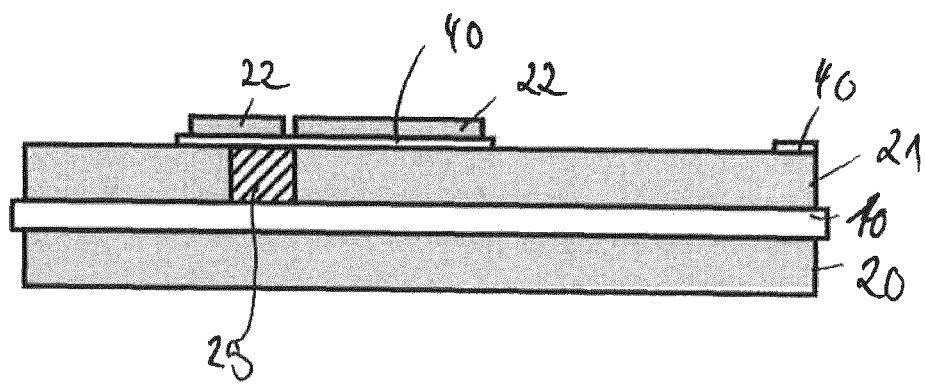

FIG. 6f shows the electronics module 100 following patterning, especially after removal of portions of the secondary pre-component metallization 22" for the purpose of forming the secondary component metallization 22 with the second thickness D2, which preferably has a patterned course on the insulation layer 40, when different metal portions, electrically insulated from each other by the insulation layer 40, are formed on the insulation layer 40. For example, such patterning is performed as part of a laser ablation process or as part of an etching process and/or a mechanical machining process.

FIGS. 7a to 7e illustrate a method according to a second example embodiment of the present invention. In particular, the producing method in FIGS. 7a to 7e essentially differs from that in FIGS. 6a to 6f in that the patterned insulation layer 40 is not applied in a full-surface covering manner and subsequently be partially removed again, but rather, using a masking 61, application of the insulation layer 40 on the primary component metallization 21 is a priori carried out solely partially. This has the advantage of saving the removal of partial areas of the full-surface applied insulation layer 40. The method steps shown in FIGS. 7c to 7e essentially correspond to those illustrated in FIGS. 6e to 6f.

FIGS. 8a to 8f illustrate a method of producing an electronics module 100 according to a third example embodiment of the present invention. In particular, the embodiment in FIGS. 8a to 8f differs from the embodiment in FIGS. 6a to 6e in that the insulation layer 40 is patterned (steps 8b and 8c) such that a recess is realized which is narrower than 1000 μm, in particular narrower than 500 μm and particularly preferably narrower than 250 μm, in particular in a direction parallel to the main extension plane HSE during the subsequent metallization of the insulation layer 40, in particular during the multistage metallization described in FIGS. 6a to 6e by the secondary initial component metallization 22' and the secondary pre-component metallization 22" to form the secondary component metallization 22, the recess is thus filled, whereby a through-plating 26 is formed or is possible.

FIGS. 9a to 9f illustrate a method of producing an electronics module 100 according to a fourth example embodiment of the present invention. In particular, the embodiment of FIGS. 9a to 9f differs from the embodiment of FIGS. 6a to 6e in that during the patterning of the metallization provided for forming the secondary component metallization 22 (step between 9e and 9f), the secondary pre-component metallization 22" is patterned such that a sideplating 27 is formed. The sideplating 27 extends beyond the edge of the insulation layer 20 and realizes an electrically conductive connection with the primary component metallization 21, which is located below the section of the secondary component metallization 22 protruding from the outermost edge of the insulation layer 40.

FIGS. 10a to 10f illustrate a method of producing an electronics module 100 according to a fifth example embodiment of the present invention. In particular, the embodiment of FIGS. 10a to 10f differs from the embodiment of FIGS. 6a to 6e in that the primary component metallization 21 is patterned or is provided in a patterned state. As a result, an isolation trench or a clearance region is formed in the primary component metallization 21 between two metal portions of the primary component metallization 21 that are arranged adjacent to each other in a direction parallel to the main extension plane HSE. Furthermore, it is provided for the insulation layer 40 to extend through the insulation trench, i.e., the insulation layer 40 covers both the metal sections of the primary component metallization 21 and the insulation trench, i.e., the upper side of the ceramic element 10, and especially the side surfaces or etching flanks of the metal sections of the primary component metallization 21. This makes it possible, for example, to effectively electrically insulate metal sections of the primary component metallization 21 from each other that are arranged comparatively close to each other. In particular, flashovers between the metal sections of the primary component metallization 21 are not to be expected. Furthermore, it is conceivable that the secondary component metallization 22, preferably produced using initial component metallization 22' and pre-component metallization 22", is patterned such that the secondary component metallization 22 extends across the region of the insulation layer 40 that extends within or through the insulation trench.

FIGS. 11a to 11f illustrate a method of producing an electronic module 100 according to a sixth example embodiment of the present invention. In particular, the embodiment of FIGS. 11a to 11f differs from the embodiment of FIGS. 6a to 6e in that the primary component metallization 21 is patterned. It is further provided for the recess or the corresponding insulation trench formed by the patterning to be filled with a filler material 29. Especially, the recess or the isolation trench is completely filled. In the subsequent metallization process, especially according to the embodiment in FIGS. 6a to 6e, a secondary component metallization 22 is formed which extends across the recess or the insulation trench. This advantageously allows greater freedom of design in forming metal sections which are insulated from each other.

The embodiments of FIGS. 8a-8f to 11a-11f may also be produced using the method of the example embodiment of FIGS. 7a to 7e.

LIST OF REFERENCE NUMBERS

1 Metal-ceramic-substrate
2 Further metal-ceramic-substrate
8 Wire bond
10 Ceramic element
15 Binding layer
16 Terminal lug
20 Cooling component metallization
21 Primary component metallization
22 Secondary component metallization
22' Secondary initial component metallization
22" Secondary pre-component metallization
23 Backside metallization
26 Through-plating
27 Sideplating
29 Filler material
31 First solder material
32 Second solder material
40 Insulation layer
45 Recess
47 Snubber
51 First electrical component
52 Second electrical component
53 Third electrical component
55 Laser light
56 Laser source
61 Masking
100 Electronics module
HSE Main extension plane
S Stacking direction
L1 First length
L2 Second length
L3 Third length
D1 First thickness
D2 Second thickness

The invention claimed is:
1. An electronics module, comprising:
a metal-ceramic substrate serving as a carrier and having a ceramic element and a primary component metallization,
an insulation layer directly or indirectly connected to the primary component metallization,
a secondary component metallization which is connected to the side of the insulation layer facing away from the metal-ceramic substrate and is isolated from the primary component metallization by the insulation layer,
wherein the ceramic element has a first size and the insulation layer has a second size and wherein a ratio of the second size to the first size assumes a value which is smaller than 0.8, to form an island-like insulation layer on the primary component metallization,
wherein at least one recess is inserted into the primary component metallization, wherein the island-like insulation layer and the secondary component metallization are arranged in the at least one recess.
2. The electronics module according to claim 1, wherein the electronics module is a power electronics module.
3. The electronics module according to claim 1, wherein the ratio of the second size to the first size has a value smaller than 0.6.
4. The electronics module according to claim 1, wherein the ratio of the second size to the first size smaller than 0.4.
5. The electronics module according to claim 1, wherein at least one first electrical component is connected to the primary component metallization and at least one second electrical component is connected to the secondary component metallization.
6. The electronics module according to claim 5, wherein the primary and secondary component are directly adjacent.

7. The electronics module according to claim 1, wherein the primary component metallization is electrically conductively connected to the secondary component metallization via through-plating or sideplating.

8. A method of producing an electronics module, the method comprising:
providing a metal-ceramic substrate with a ceramic element and a primary component metallization,
forming an island-like insulation layer on the primary component metallization, the ceramic element having a first size and the insulation layer having a second size, the formed insulation layer having a second size, the formed island-like insulation layer on the primary component metallization is dimensioned such that a ratio of the second size to the first size has a value smaller than 0.8, and
forming a secondary component metallization on the island-like insulation layer,
wherein at least one recess is inserted into the primary component metallization, wherein the island-like insulation layer and the secondary component metallization are arranged in the at least one recess.

9. The method according to claim 8, wherein the ratio of the second size to the first size has a value smaller than 0.6.

10. The method of claim 8, wherein the ratio of the second size to the first size smaller than 0.4.

11. The method according to claim 8, wherein for forming the island-like insulation layer,
a layer of an insulation material is connected to the primary component metallization, and the connected layer of the insulation material is patterned and/or
insulation material is patterned onto the primary component metallization using a masking.

12. The method according to claim 8, wherein the layer of insulation material is a continuous and/or flat layer.

13. The method according to claim 8, wherein a layer of a metal material is connected to a precomposite comprising the metal-ceramic substrate and the island-like insulation layer, and wherein the layer of the metal material connected to the precomposite is patterned to form the secondary component metallization.

14. The method according to claim 8, wherein at least one first component is connected to the primary component metallization and at least a second component is connected to the secondary component metallization.

15. The method according to claim 14, wherein
the at least one first component and/or the primary component metallization and
the at least one second component and/or the secondary component metallization are electrically conductively connected to each other via at least one wire bond.

* * * * *